United States Patent
Chang Chien et al.

(10) Patent No.: US 10,629,559 B2
(45) Date of Patent: Apr. 21, 2020

(54) SEMICONDUCTOR PACKAGE AND MANUFACTURING METHOD THEREOF

(71) Applicant: Powertech Technology Inc., Hsinchu County (TW)

(72) Inventors: Shang-Yu Chang Chien, Hsinchu County (TW); Hung-Hsin Hsu, Hsinchu County (TW); Nan-Chun Lin, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 16/136,197

(22) Filed: Sep. 19, 2018

(65) Prior Publication Data

US 2020/0091103 A1 Mar. 19, 2020

(51) Int. Cl.
*H01L 23/00* (2006.01)
*H01L 23/31* (2006.01)
*H01L 21/56* (2006.01)

(52) U.S. Cl.
CPC .............. *H01L 24/17* (2013.01); *H01L 21/56* (2013.01); *H01L 23/3185* (2013.01); *H01L 24/09* (2013.01); *H01L 24/32* (2013.01); *H01L 2224/02371* (2013.01); *H01L 2924/3512* (2013.01)

(58) Field of Classification Search
CPC ......... H01L 24/17; H01L 24/09; H01L 24/32; H01L 21/56; H01L 23/3185; H01L 2224/02371; H01L 2924/3512
USPC ....................................................... 257/692
See application file for complete search history.

(56) References Cited

U.S. PATENT DOCUMENTS

| | | | |
|---|---|---|---|
| 2013/0171774 A1* | 7/2013 | Chen | H01L 25/16 438/121 |
| 2016/0351462 A1 | 12/2016 | Kuan et al. | |
| 2018/0151453 A1* | 5/2018 | Yu | H01L 24/11 |
| 2018/0166396 A1* | 6/2018 | Lee | H01L 23/562 |

FOREIGN PATENT DOCUMENTS

| | | |
|---|---|---|
| TW | 201717296 | 5/2017 |
| TW | 201807762 | 3/2018 |
| TW | 201820464 | 6/2018 |
| TW | 201834168 | 9/2018 |

OTHER PUBLICATIONS

"Office Action of Taiwan Counterpart Application", dated May 15, 2019, pp. 1-7.

* cited by examiner

*Primary Examiner* — Tong-Ho Kim
(74) *Attorney, Agent, or Firm* — JCIPRNET

(57) ABSTRACT

A package structure including a semiconductor die, an insulating encapsulant, a dielectric layer, and a redistribution layer is provided. The semiconductor die has an active surface, a back surface opposite to the active surface, and a plurality of conductive bumps disposed on the active surface. The insulating encapsulant is encapsulating the semiconductor die. The redistribution layer is disposed on the he insulating encapsulant and electrically connected to the plurality of conductive bumps. The dielectric layer is disposed between the insulating encapsulant and the redistribution layer, wherein the dielectric layer encapsulates at least a portion of each of the plurality of conductive bumps.

10 Claims, 7 Drawing Sheets

SEMICONDUCTOR PACKAGE AND MANUFACTURING METHOD THEREOF

BACKGROUND

Technical Field

The invention relates to a package structure and a manufacturing method thereof, and more particularly, relates to a package structure having better package performance and reliability.

Description of Related Art

In order for electronic product design to achieve being light, slim, short, and small, semiconductor packaging technology has kept progressing, in attempt to develop products that are smaller in volume, lighter in weight, higher in integration, and more competitive in market. For example, fan-out packages have become increasingly popular due to their compactness. However, with the reduction of product size, many problems such as package reliability and cracking issue has become critical. Improved reliability and performance provided by integrated fan-out packages while eliminating the cracking issue of the semiconductor die are the key factors for future packages.

SUMMARY

Accordingly, the present invention is directed to a package structure and a method of manufacturing thereof, wherein the package structure enhances the package performance and reliability while avoiding a cracking issue of the semiconductor die.

The disclosure provides a package structure including a semiconductor die, an insulating encapsulant, a dielectric layer, and a redistribution layer. The semiconductor die has an active surface, a back surface opposite to the active surface, and a plurality of conductive bumps disposed on the active surface. The insulating encapsulant encapsulates the semiconductor die. The redistribution layer is disposed on the insulating encapsulant and electrically connected to the plurality of conductive bumps. The dielectric layer is disposed between the insulating encapsulant and the redistribution layer, wherein the dielectric layer encapsulates at least a portion of each of the plurality of conductive bumps.

The disclosure further provides a manufacturing method of a package structure. The method includes at least the following steps. A carrier is provided. An adhesive layer is formed on the carrier. A semiconductor die is bonded on the adhesive layer, wherein the semiconductor die has an active surface, a back surface opposite to the active surface, and a plurality of conductive bumps disposed on the active surface. The semiconductor die is bonded on the adhesive layer in a face-down manner such that the plurality of conductive bumps is facing the adhesive layer. An insulating encapsulant is formed on the adhesive layer to encapsulate the semiconductor die. The carrier is de-bonded such that the adhesive layer is separated from the semiconductor die and the insulating encapsulant. A dielectric layer is formed on the insulating encapsulant to cover the active surface of the semiconductor die and the insulating encapsulant. A redistribution layer is formed on the dielectric layer and the semiconductor die, wherein the redistribution layer is electrically connected to the plurality of conductive bumps.

Based on the above, the package structure of the disclosure is formed with a semiconductor die having a plurality of conductive bumps encapsulated by a dielectric layer, or encapsulated by a dielectric layer and an insulating encapsulant. Furthermore, a back surface and sidewalls of the semiconductor die is encapsulated and protected by the insulating encapsulant. As such, a package reliability and performance can be improved, and a cracking issue can be avoided.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
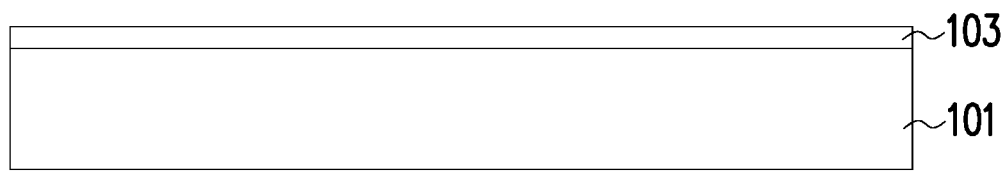
FIGS. 1A to 1H are schematic cross-sectional views illustrating a manufacturing method of a package structure according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1H are schematic cross-sectional views illustrating a manufacturing method of a package structure according to an embodiment of the invention.

Referring to FIG. 1A, a carrier 101 is provided. In some embodiments, the carrier 101 may be made of silicon, polymer, or other suitable materials. In some other embodiments, the carrier 101 may be a glass substrate or a glass supporting board. Other suitable substrate materials may be adapted as the carrier 101 as long as the material is able to withstand the subsequent processes while carrying the package structure formed thereon. As shown in FIG. 1A, an adhesive layer 103 is formed on the carrier 101 to enhance the adhesion between the carrier 101 and the other structures subsequently formed thereon, and to improve the rigidity of the overall package structure during the manufacturing process. In certain embodiments, the adhesive layer 103 may be a light to heat conversion (LTHC) adhesive layer, and such layer enables room temperature de-bonding from the carrier by applying laser irradiation. However, this construes no limitation in the invention, in alternative embodiments, other types of suitable adhesive layers may be used depending on requirement.

Figure 1B:
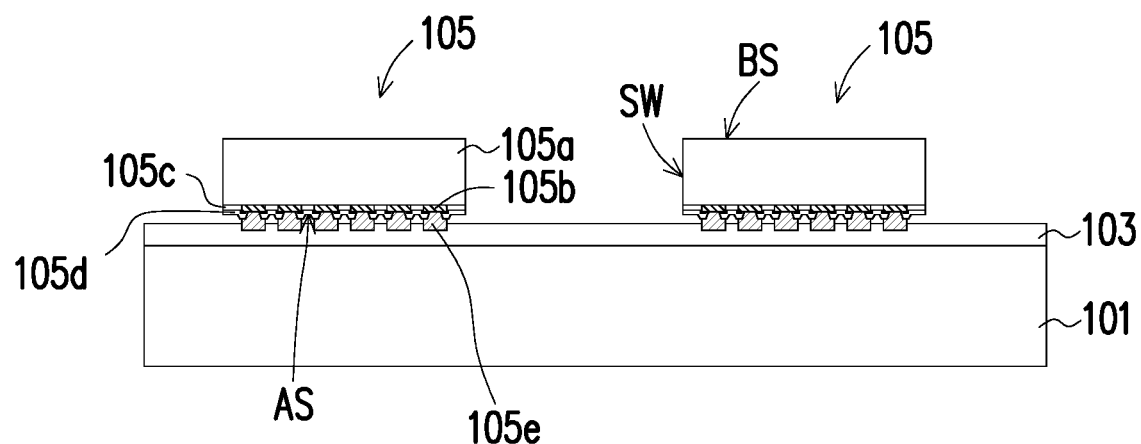

Referring to FIG. 1B, after forming the adhesive layer 103 on the carrier 101, at least one semiconductor die 105 may be disposed on the carrier 101. In the illustrated embodiment, the semiconductor die 105 is bonded on the adhesive layer 103. Although only two semiconductor dies 105 are illustrated, it should be noted that the number of semiconductor dies is not limited thereto, and this can be adjusted based on requirement. Each of the semiconductor dies 105 may comprise a semiconductor substrate 105a, a plurality of contact pads 105b, a passivation layer 105c, a post-passivation layer 105d and a plurality of conductive bumps 105e.

The plurality of contact pads 105b is disposed on the semiconductor substrate 105a. The passivation layer 105c is disposed on the semiconductor substrate 105a and has openings that partially expose the contact pads 105b. The post-passivation layer 105d covers the passivation layer 105c and has a plurality of openings that expose at least a portion of the contact pads 105b. The plurality of conductive bumps 105e is disposed within the openings to cover the exposed portion of the contact pads 105b.

The semiconductor die 105 has an active surface AS and a back surface BS opposite to the active surface AS. The plurality of conductive bumps 105e is disposed on the active surface AS of the semiconductor die 105. In some embodiments, the semiconductor die 105 may be bonded on the adhesive layer 103 in a face-down manner such that the plurality of conductive bumps 105e is facing the adhesive layer 103. As illustrated in FIG. 1B, the plurality of conductive bumps 105e partially sinks into the adhesive layer 103 during bonding. In some embodiments, a height of the conductive bumps 105e is approximately 20 µm to 50 µm, and 5 µm to 10 µm of the conductive bumps 105e may sink into the adhesive layer 103. In other words, a gap exists in between the adhesive layer 103 and the active surface AS of the semiconductor die 105.

Figure 1C:
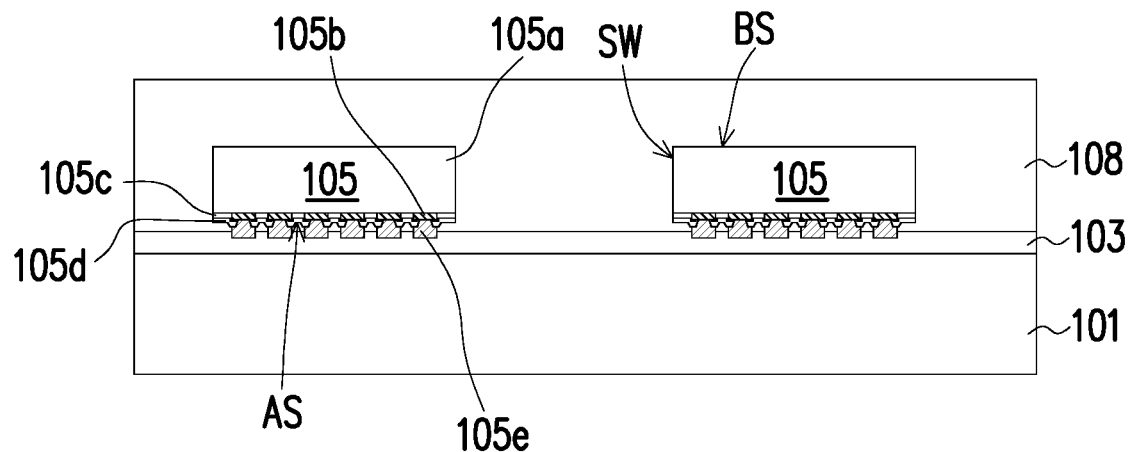

Referring to FIG. 1C, after bonding the semiconductor die 105 on the adhesive layer 103, an insulating encapsulant 108 is formed on the adhesive layer 103 to cover and encapsulate the semiconductor die 105. The insulating encapsulant 108 covers at least the back surface BS and side surfaces SW of the semiconductor die 105. In some embodiments, the insulating encapsulant 108 may completely cover the back surface BS of the semiconductor die 105. In certain embodiments, the insulating encapsulant 108 is formed to fill in the gaps in between the adhesive layer 103 and the active surface AS of the semiconductor die 105 so that the plurality of conductive bumps 105e is encapsulated by the insulating encapsulant 108. The insulating encapsulant 108 may be formed through a molding process. For example, a material of the insulating encapsulant 108 may include an epoxy resin or other suitable polymer materials. In some other embodiments, the insulating encapsulant 108 may be an epoxy resin or other suitable polymer materials including fillers distributed therein. A material of the fillers includes silicon dioxide, aluminum oxide, or other suitable materials. The fillers are capable of reinforcing mechanical strength of the insulating encapsulant 108 such that the insulating encapsulant 108 may well protect the semiconductor die 105.

Figure 1D:
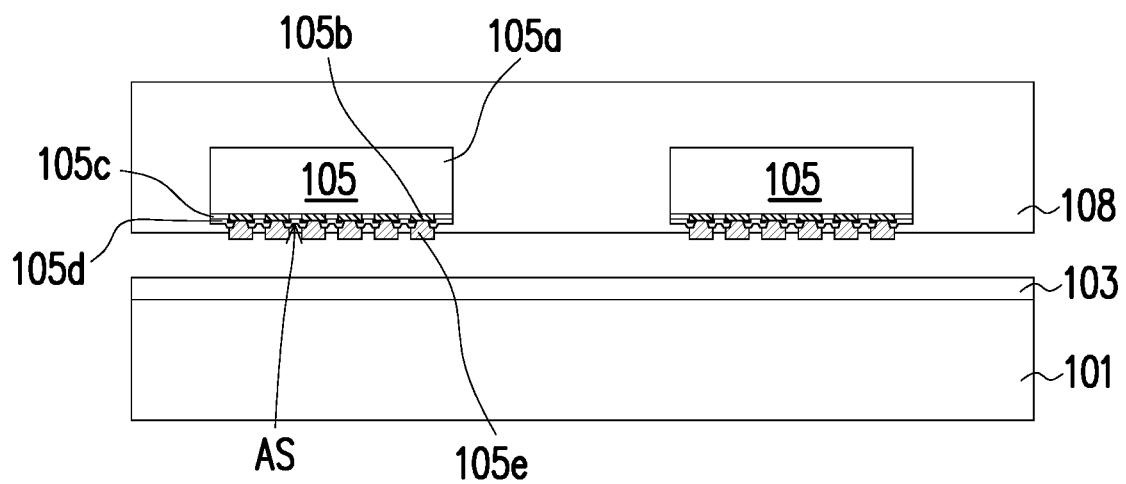

Referring to FIG. 1D, after forming the insulating encapsulant 108 on the adhesive layer 103, the carrier 101 and the adhesive layer 103 are de-bonded or separated from the insulating encapsulant 108 and the semiconductor die 105. In some embodiments, the adhesive layer 103 (e.g. LTHC release layer) is irradiated by UV laser such that other components formed thereon can be de-bonded from the adhesive layer 103 and the carrier 101. After the de-bonding process, the plurality of conductive bumps 105e are revealed, and the active surface AS of the semiconductor die 106 is covered by the insulating encapsulant 108. Furthermore, the plurality of conductive bumps 105e protrude out from the insulating encapsulant 108.

Figure 1E:
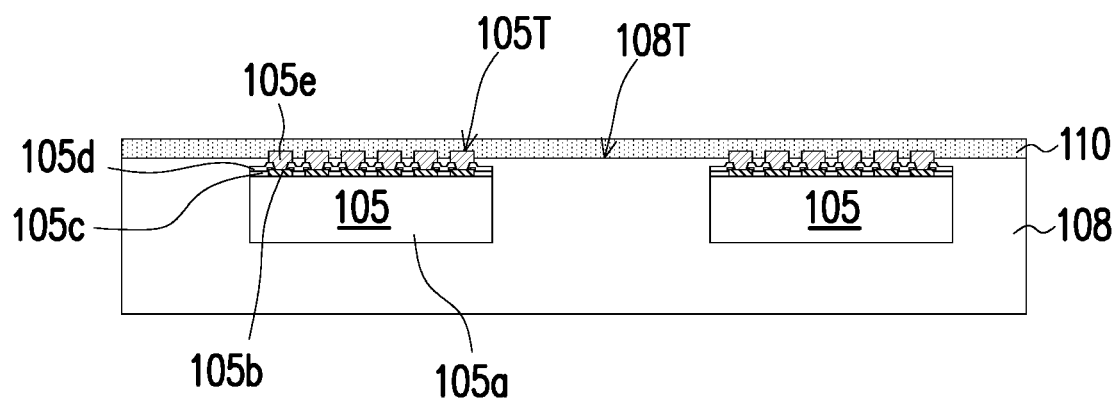

Referring to FIG. 1E, after de-bonding the carrier 101 and the adhesive layer 103, a dielectric layer 110 is formed on the insulating encapsulant 108 to cover the plurality of conductive bumps 105e. In some embodiments, the dielectric layer 110 covers a top surface 108T of the insulating encapsulant 108 and the top surfaces 105T of plurality of conductive bumps 105e. For example, the dielectric layer 110 may completely cover a top surface 108T of the insulating encapsulant 108. In addition, the dielectric layer 110 fills up the gaps in between the plurality of conductive bumps 105e. The dielectric layer 110 may be made of non-organic or organic dielectric materials such as silicon oxide, silicon nitride, silicon carbide, silicon oxynitride, polyimide, benzocyclobutene (BCB), or the like.

Figure 1F:
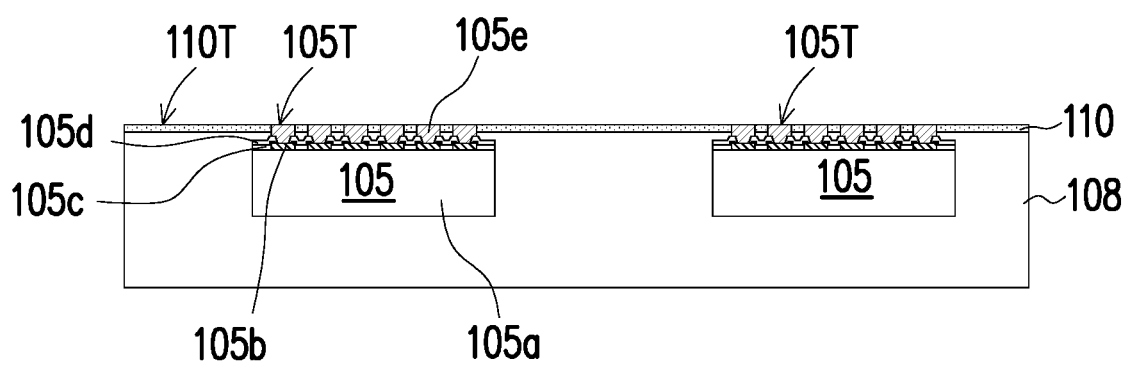

Referring to FIG. 1F, after forming the dielectric layer 110, a thinning step of the dielectric layer 110 is performed until the top surfaces 105T of the plurality of conductive bumps 105e are revealed. The thinning process includes performing a mechanical grinding process, a chemical-mechanical grinding (CMP) process, an etching process, other suitable processes, or the combinations thereof. After the thinning process, the top surfaces 105T of the plurality of conductive bumps 105e are substantially coplanar with a top surface 110T of the dielectric layer 110. In some embodiments, a height of the plurality of conductive bumps 105e is in a range from 3 µm to 20 µm after the thinning process. That is, the conductive bumps 105e may be slightly grinded during the thinning process. As illustrated in FIG. 1F, sidewalls of the plurality of conductive bumps 105e are encapsulated by the dielectric layer 110 and the insulating encapsulant 108.

Figure 1G:
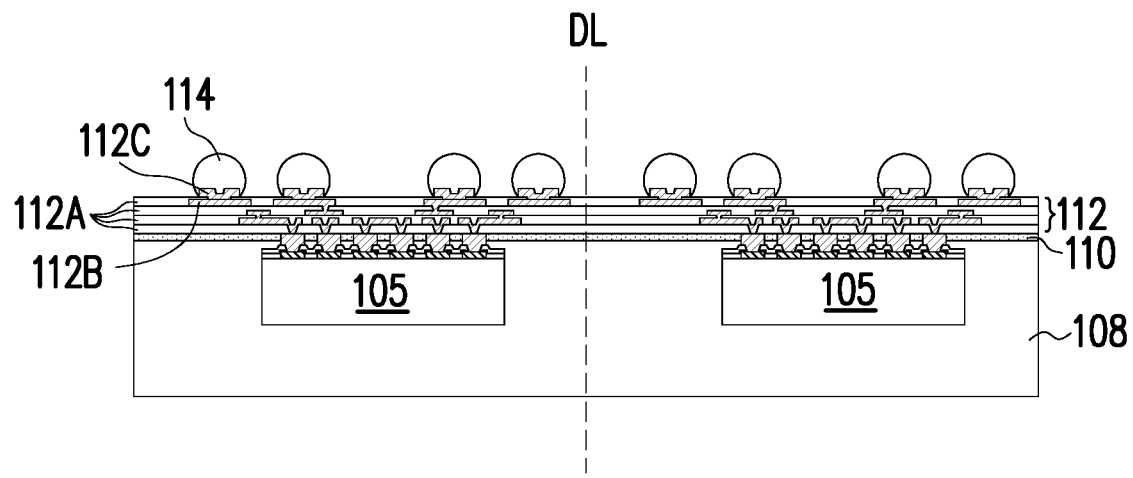

Referring to FIG. 1G, after thinning the dielectric layer 110, a redistribution layer 112 is formed on the dielectric layer 110 and the semiconductor dies 105. In some embodiments, the redistribution layer 112 includes a plurality of dielectric layers 112A and a plurality of conductive layers 112B alternately formed. The plurality of dielectric layers 112A may be made of non-organic or organic dielectric materials such as silicon oxide, silicon nitride, silicon carbide, silicon oxynitride, polyimide, benzocyclobutene (BCB), or the like, but the disclosure is not limited thereto. The plurality of conductive layers 112B may be made of copper, aluminum, nickel, or other suitable conductive materials, but the disclosure is not limited thereto.

As illustrated in FIG. 1G, the redistribution layer 112 is electrically connected to the semiconductor die 105. Furthermore, the conductive layers 112B is electrically connected to the plurality of conductive bumps 105e of the semiconductor die 105. In the illustrated embodiment, four dielectric layers 112A and three conductive layers 112B are shown, however, this construe no limitation in the invention. In alternative embodiments, the number of dielectric layers 112A and conductive layers 112B may be adjusted based on product design. In some embodiments, the topmost dielectric layer 112A of the redistribution layer 112 may include a plurality of conductive pads 112C disposed thereon. The conductive pads 112C are for example, under-ball metallurgy (UBM) patterns used for ball mount. In some other embodiments, the conductive pads (UBM patterns) are omitted. In some embodiments, the dielectric layer 110 separates the redistribution layer 112 from the insulating encapsulant 108.

After forming the redistribution layer 112, a plurality of conductive terminals 114 may optionally be disposed on the redistribution layer 112. The plurality of conductive terminals 114 is electrically connected to the plurality of conductive bumps 105e through the redistribution layer 112. In some embodiments, the conductive terminals 114 may include tin balls or solder balls. However, this construe no limitation in the invention. In certain embodiments, the conductive terminals 114 may be formed by performing a ball mounting process or a reflow process.

Figure 1H:
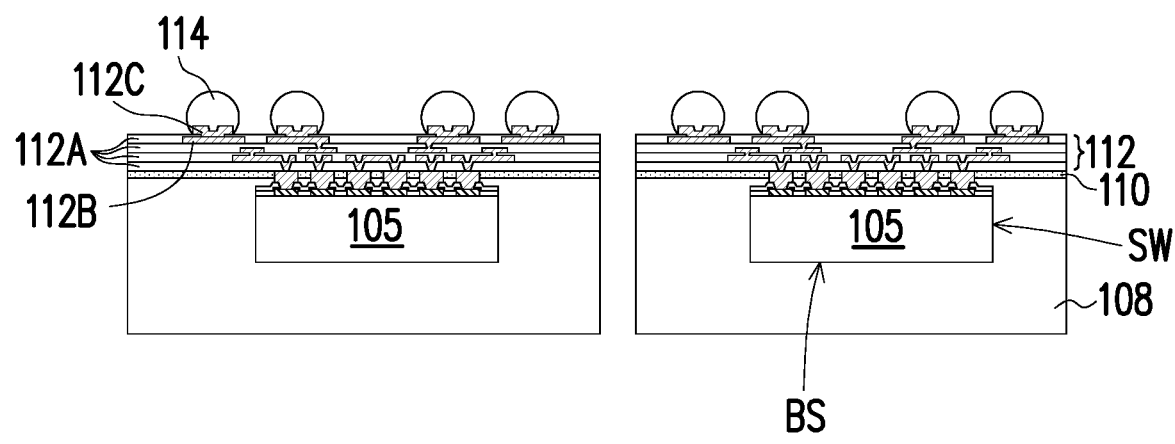

Referring to FIG. 1H, after forming the plurality of conductive terminals 114 on the redistribution layer 112, a dicing process is performed along the dicing lines DL (shown in FIG. 1G) to cut the whole wafer structure or panel structure (cutting through the insulating encapsulant 108, the dielectric layer 110, and the redistribution layer 112) into a plurality of packages 10. After the dicing process, the sidewalls of the dielectric layer 110 are aligned with sidewalls of the insulating encapsulant 108 and sidewalls of the redistribution layer 112. In the exemplary embodiment, the dicing process is a wafer dicing or a panel dicing process including mechanical blade sawing or laser cutting.

In the completed structure, the back surface BS of the semiconductor die 105 of each of the packages 10 are covered by the insulating encapsulant 108. Therefore, a better die backside protection can be achieved, and moisture penetration can be avoided. Furthermore, the conductive bumps 105e are encapsulated by the dielectric layer 110 and the insulating encapsulant 108. And, the top surfaces (105T/110T) of the conductive bumps 105e and dielectric layer 110 are substantially coplanar. These features enhance the package reliability and performance, and avoids a cracking issue of the die.

FIGS. 2A to 2F are schematic cross-sectional views illustrating a manufacturing method of a package structure according to another embodiment of the present invention. The embodiment shown in FIG. 2A to FIG. 2F is similar to the embodiment shown in FIG. 1A to FIG. 1H, hence the same reference numerals will be used to refer to the same or liked parts, and its detailed description will be omitted herein. The difference between these embodiments is in the way the semiconductor die 105 is bonded on the carrier 101.

Figure 2A:
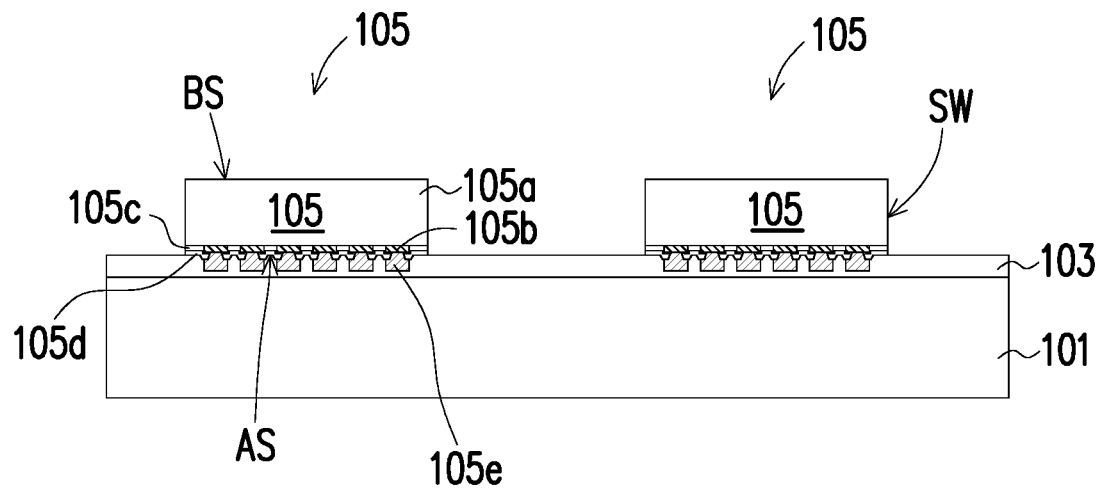
FIGS. 2A to 2F are schematic cross-sectional view illustrating a package structure according to another embodiment of the present invention.

As shown in FIG. 2A, after forming an adhesive layer 103 on the carrier 101 (step of FIG. 1B), a plurality of semiconductor die 105 is disposed on the carrier 101. In the illustrated embodiment, the semiconductor die 105 is bonded on the adhesive layer 103 in a face-down manner. During the step of bonding the semiconductor die 105, the plurality of conductive bumps 105e is fully trapped into the adhesive layer 103. In other words, the plurality of conductive bumps 105e are not exposed from the adhesive layer 103, and the active surface AS of the semiconductor die 105 is in contact with the adhesive layer 103. In some embodiments, a height of the conductive bumps 105e is approximately 20 μm to 50 μm, and the conductive bumps 105e completely sinks into the adhesive layer 103. Therefore, no gap exists in between the adhesive layer 103 and the active surface AS of the semiconductor die 105.

Figure 2B:
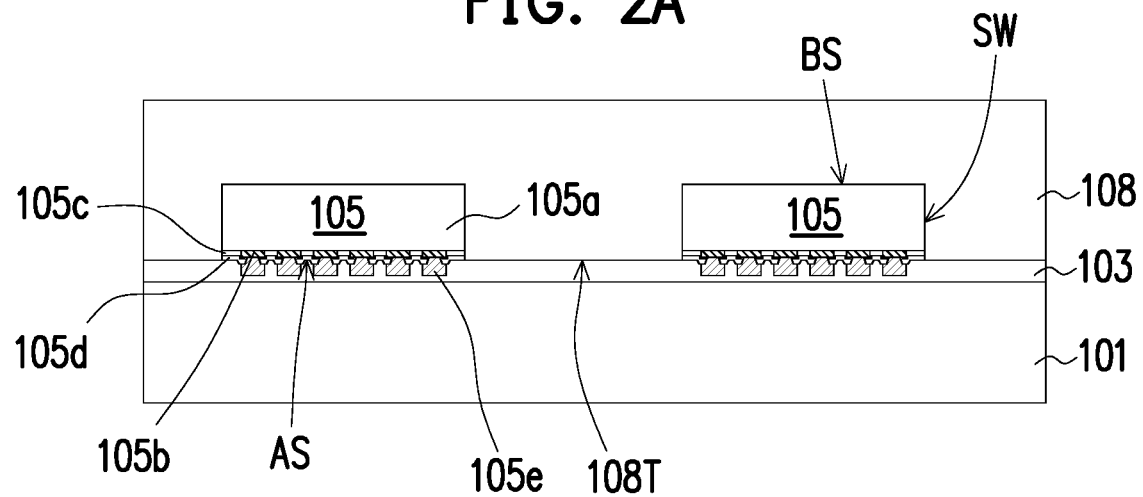

Referring to FIG. 2B, after bonding the semiconductor die 105 on the adhesive layer 103, an insulating encapsulant 108 is formed on the adhesive layer 103 to cover and encapsulate the semiconductor die 105. The insulating encapsulant 108 covers at least the back surface BS and side surfaces SW of the semiconductor die 105. In some embodiments, the insulating encapsulant 108 may completely cover the back surface BS of the semiconductor die 105. Furthermore, as shown in FIG. 2B, a top surface 108T of the insulating encapsulant 108 is formed to be substantially coplanar with the active surface AS of the semiconductor die 105.

Figure 2C:
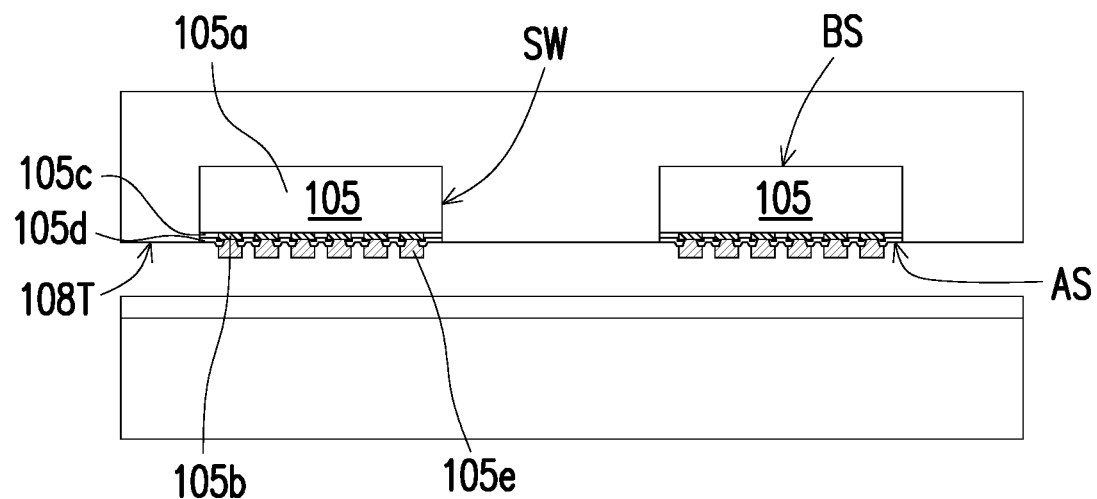

Referring to FIG. 2C, after forming the insulating encapsulant 108 on the adhesive layer 103, the carrier 101 and the adhesive layer 103 are de-bonded or separated from the insulating encapsulant 108 and the semiconductor die 105. After the de-bonding process, the plurality of conductive bumps 105e are revealed.

Figure 2D:
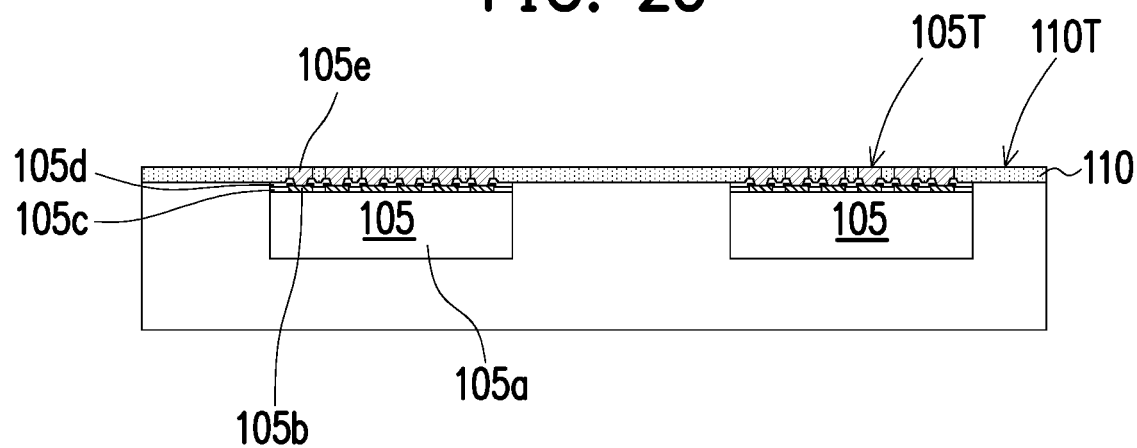

Referring to FIG. 2D, after de-bonding the carrier 101 and the adhesive layer 103, a dielectric layer 110 is formed on the insulating encapsulant 108 to cover the plurality of conductive bumps 105e. Subsequently, a thinning step of the dielectric layer 110 is performed until the top surfaces 105T of the plurality of conductive bumps 105e are revealed. After the thinning process, the top surfaces 105T of the plurality of conductive bumps 105e are substantially coplanar with a top surface 110T of the dielectric layer 110, and a height of the plurality of conductive bumps 105e is in a range from 3 μm to 20 μm. In addition, the plurality of conductive bumps 105e is encapsulated by the dielectric layer 110.

Figure 2E:
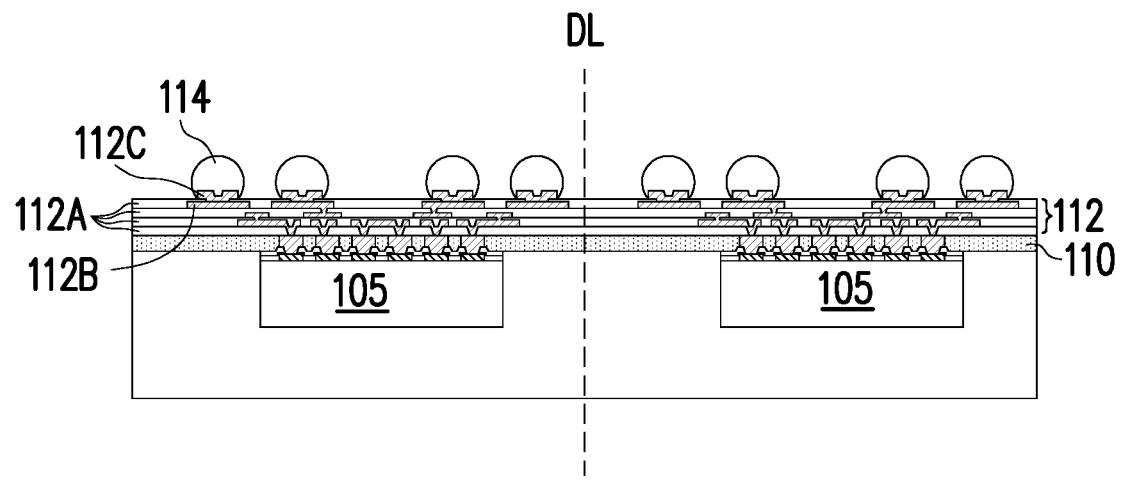

Referring to FIG. 2E, after thinning the dielectric layer 110, a redistribution layer 112 is formed on the dielectric layer 110 and the semiconductor dies 105. Similar to the embodiment of FIG. 1G, the redistribution layer 112 of FIG. 2E includes a plurality of dielectric layers 112A and a plurality of conductive layers 112B alternately formed. In some embodiments, the topmost dielectric layer 112A of the redistribution layer 112 may include a plurality of conductive pads 112C disposed thereon. The conductive pads 112C are for example, under-ball metallurgy (UBM) patterns used for ball mount. In some other embodiments, the conductive pads (UBM patterns) are omitted. After forming the redistribution layer 112, a plurality of conductive terminals 114 may optionally be disposed on the redistribution layer 112. The plurality of conductive terminals 114 is electrically connected to the plurality of conductive bumps 105e through the redistribution layer 112.

Figure 2F:
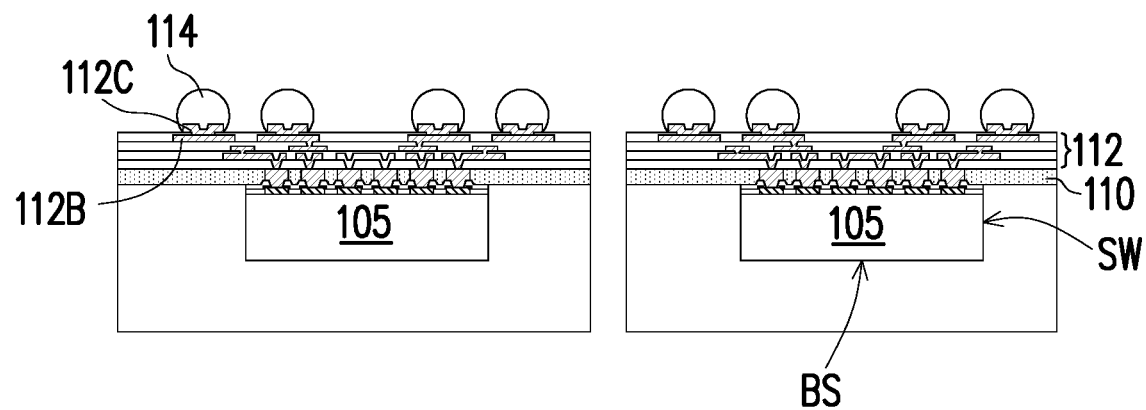

Referring to FIG. 2F, after forming the plurality of conductive terminals 114 on the redistribution layer 112, a dicing process is performed along the dicing lines DL (shown in FIG. 2E) to cut the whole wafer structure or panel structure (cutting through the insulating encapsulant 108, the dielectric layer 110, and the redistribution layer 112) into a plurality of packages 20. After the dicing process, the sidewalls of the dielectric layer 110 are aligned with sidewalls of the insulating encapsulant 108 and sidewalls of the redistribution layer 112.

In the completed structure, back surface BS of the semiconductor die 105 of each of the packages 20 are covered by the insulating encapsulant 108. Therefore, a better die backside protection can be achieved, and moisture penetration can be avoided. Furthermore, the conductive bumps 105e are encapsulated by the dielectric layer 110. And, the top surfaces (105T/110T) of the conductive bumps 105e and dielectric layer 110 are substantially coplanar. These features enhance the package reliability and performance, and avoids a cracking issue of the die.

Based on the above, the package structure of the disclosure is formed with a semiconductor die having its backside protected by the insulating encapsulant. Furthermore, the conductive bumps are encapsulated by the dielectric layer or encapsulated by the dielectric layer and the insulating encapsulant. As such, a package reliability and performance can be improved, and a cracking issue can be avoided.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A manufacturing method of a package structure, comprising:
   providing a carrier;
   forming an adhesive layer on the carrier;

bonding a semiconductor die on the adhesive layer, wherein the semiconductor die has an active surface, a back surface opposite to the active surface, and a plurality of conductive bumps disposed on the active surface, and the semiconductor die is bonded on the adhesive layer in a face-down manner such that the plurality of conductive bumps is facing the adhesive layer;

forming an insulating encapsulant on the adhesive layer and encapsulating the semiconductor die;

de-bonding the carrier by separating the adhesive layer from the semiconductor die and the insulating encapsulant;

forming a dielectric layer covering the active surface of the semiconductor die, and covering the insulating encapsulant, wherein the dielectric layer encapsulates at least a portion of each of the plurality of conductive bumps; and forming a redistribution layer on the dielectric layer and the semiconductor die, wherein the redistribution layer is electrically connected to the plurality of conductive bumps.

2. The manufacturing method according to claim 1, wherein during a step of bonding the semiconductor die on the adhesive layer, the plurality of conductive bumps partially sinks into the adhesive layer.

3. The manufacturing method according to claim 2, wherein the insulating encapsulant is formed to fill up the gaps in between the adhesive layer and the active surface of the semiconductor die so that the plurality of conductive bumps is encapsulated by the insulating encapsulant.

4. The manufacturing method according to claim 1, wherein during a step of bonding the semiconductor die on the adhesive layer, the plurality of conductive bumps is fully trapped into the adhesive layer.

5. The manufacturing method according to claim 4, wherein a top surface of the insulating encapsulant is formed to be coplanar with the active surface of the semiconductor die.

6. The method according to claim 1, wherein after forming the dielectric layer, a thinning step of the dielectric layer is performed until a top surface of the dielectric layer is coplanar with a top surface of the plurality of conductive bumps.

7. The method according to claim 6, wherein a height of the conductive bumps after the thinning step is in a range from 3 μm to 20 μm.

8. The method according to claim 1, wherein the plurality of conductive bumps is encapsulated by the dielectric layer or encapsulated by the dielectric layer and the insulating encapsulant.

9. The method according to claim 1, wherein the dielectric layer is formed to completely cover a top surface of the insulating encapsulant so that the dielectric layer separates the redistribution layer from the insulating encapsulant.

10. The method according to claim 1, wherein sidewalls of the dielectric layer are aligned with sidewalls of the insulating encapsulant and sidewalls of the redistribution layer.

* * * * *